(12) United States Patent
Kim (10) Patent No.: US 8,547,758 B2
(45) Date of Patent: Oct. 1, 2013

(54) SEMICONDUCTOR MEMORY DEVICE AND METHOD OF OPERATING THE SAME

(75) Inventor: Bo Kyeom Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 98 days.

(21) Appl. No.: 13/182,526

(22) Filed: Jul. 14, 2011

(65) Prior Publication Data

US 2012/0140573 A1 Jun. 7, 2012

(30) Foreign Application Priority Data

Dec. 3, 2010 (KR) .................. 10-2010-0122910

(51) Int. Cl.
*G11C 7/10* (2006.01)
(52) U.S. Cl.
USPC .................................................... 365/189.05
(58) Field of Classification Search
USPC .................................................... 365/189.05
See application file for complete search history.

(56) References Cited

U.S. PATENT DOCUMENTS

| | | | | |
|---|---|---|---|---|
| 7,457,158 B2* | 11/2008 | Lee et al. | .................. | 365/185.03 |
| 2005/0232025 A1* | 10/2005 | Ju | .......................... | 365/189.05 |
| 2007/0183199 A1* | 8/2007 | Chung | ..................... | 365/185.08 |
| 2008/0266950 A1* | 10/2008 | Kang et al. | ............... | 365/185.05 |
| 2008/0266961 A1* | 10/2008 | Joo | .......................... | 365/185.12 |
| 2009/0161443 A1* | 6/2009 | Yang et al. | ............... | 365/189.05 |

FOREIGN PATENT DOCUMENTS

| KR | 1020050112988 | 12/2005 |
|---|---|---|
| KR | 1020060016553 | 2/2006 |

OTHER PUBLICATIONS

Notice of Allowance issued by the Korean Intellectual Property Office on Dec. 20, 2012.

* cited by examiner

*Primary Examiner* — Hoai V Ho
*Assistant Examiner* — Pablo Huerta
(74) *Attorney, Agent, or Firm* — IP & T Group LLP (57) ABSTRACT

A semiconductor memory device includes a page buffer configured to store data received from selected memory cells in response to a read command, a first register configured to store first data received from the page buffer in response to a first control signal, a second register configured to store second data received from the page buffer in response to a second control signal, a data I/O circuit configured to, while the first or second data is outputted from the first register or the second register, respectively, input third data received from the page buffer to the other one of the first and second registers, and a control logic configured to sequentially supply the first control signal and the second control signal in outputting the first and second data.

11 Claims, 10 Drawing Sheets

SEMICONDUCTOR MEMORY DEVICE AND METHOD OF OPERATING THE SAME

CROSS-REFERENCE TO RELATED APPLICATION

Priority to Korean patent application number 10-2010-0122910 filed on Dec. 3, 2010, the entire disclosure of which is incorporated by reference herein, is claimed.

BACKGROUND

Exemplary embodiments relate to a semiconductor memory device and a method of operating the same.

As semiconductor technology advances, the operating speed of a semiconductor memory device increases and power consumption thereof decreases.

In increasing the data I/O rate of the semiconductor memory device, data is outputted in synchronism with a reference clock signal and, particularly, with both the rising edge and the falling edge of a clock signal.

In obtaining appropriate system performance, the semiconductor memory device may be designed to output or receive 16, 32, or 64 data at one step. In order to output the plurality of data at one step, appropriate data lines and related circuits (e.g., data output buffers) corresponding to the respective output data amount are to be included in the semiconductor memory device.

If the number of data lines is increased in order to output a large amount of data at one step, the area of the semiconductor memory device may increase. Accordingly, an increase in the number of data lines is to be limited.

BRIEF SUMMARY

Exemplary embodiments relate to a semiconductor memory device and a method of operating the same, which are capable of increasing the amount of data, outputted at once, and the output speed by increasing the loading size of data to be outputted without increasing the number of data lines.

A semiconductor memory device according to an aspect of the present disclosure includes a page buffer configured to store data received from selected memory cells in response to a read command, a first register configured to store first data received from the page buffer in response to a first control signal, a second register configured to store second data received from the page buffer in response to a second control signal, a data I/O circuit configured to, while the first or second data is outputted from the first register or the second register, respectively, input third data received from the page buffer to the other one of the first and second registers, a multiplexer configured to receive the first and second data in response to third and fourth control signals and alternately output the first and second data in response to a data output signal, and a control logic configured to sequentially supply the first control signal and the second control signal in outputting the first and second data.

A method of operating a semiconductor memory device according to another aspect of the present disclosure includes storing a plurality of data read from selected memory cells in page buffers, storing a first data group of the data in a first register and storing a second data group of the data in a second register group, outputting the first data group stored in the first register group and outputting the second data group stored in the second register group and storing a third data group of the data in the first register group during outputting the second data group.

DESCRIPTION OF EMBODIMENTS

Hereinafter, exemplary embodiments of the present disclosure will be described in detail with reference to the accompanying drawings. The figures are provided to enable a person of ordinary skill in the art to make and use the exemplary embodiments of the disclosure.

Figure 1:
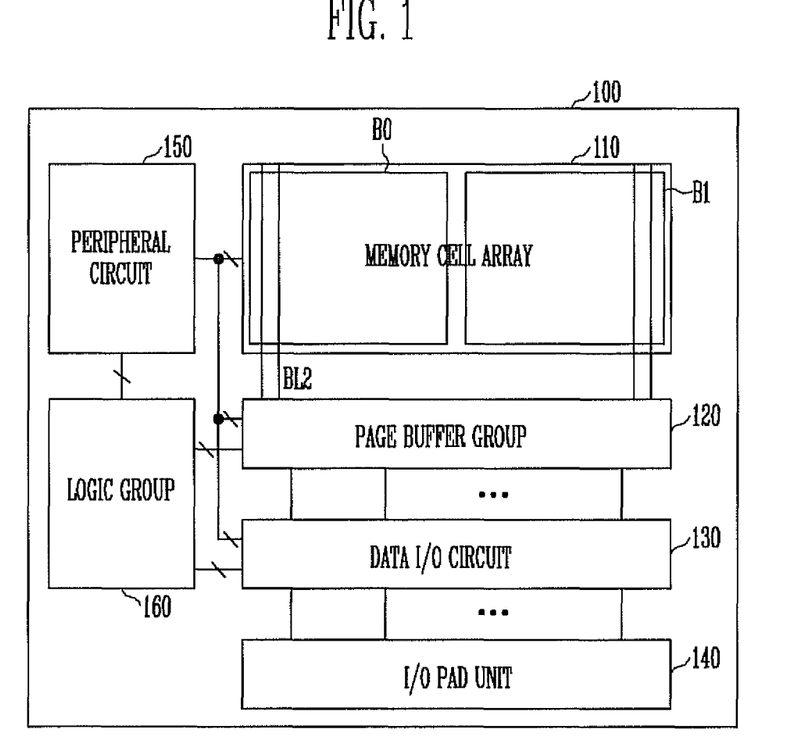
FIG. 1 shows a semiconductor memory device for illustrating this disclosure.

FIG. 1 shows a semiconductor memory device for illustrating this disclosure.

Referring to FIG. 1, the semiconductor memory device 100 includes a memory cell array 110, a page buffer group 120, a data I/O circuit 130, an I/O pad unit 140, a peripheral circuit 150, and a logic group 160.

The memory cell array 110 includes memory cells for storing data. The memory cells are coupled to word lines (not shown) and bit lines BL. The memory cell array 110 includes first and second banks B0 and B1.

The memory cells can be selected by selecting a word line and a bit line BL.

The page buffer group 120 includes a plurality of page buffers. Each of the page buffers is coupled to at least one bit line and is configured to temporarily store data to be stored in selected memory cells or to read data stored in selected memory cells and store the read data.

The data I/O circuit 130 is operated to perform data I/O between the page buffer group 120 and the I/O pad unit 140. The data I/O circuit 130 includes a sense circuit SA (not shown) for sensing data outputted from the page buffer group 120 and transferring the sensed data to the I/O pad unit 140.

The I/O pad unit 140 includes pads PAD coupled to input/output data from/to outside the semiconductor memory device 100.

The peripheral circuit 150 includes circuits that interact with the page buffer group 120 when data is read from the memory cells or data is stored in the memory cells.

The logic group 160 generates control signals for controlling the operations of the page buffer group 120, the data I/O circuit 130, the I/O pad unit 140, and the peripheral circuit 150.

The page buffer group 120, the data I/O circuit 130, and the I/O pad unit 140 are described as follows.

Figure 2:
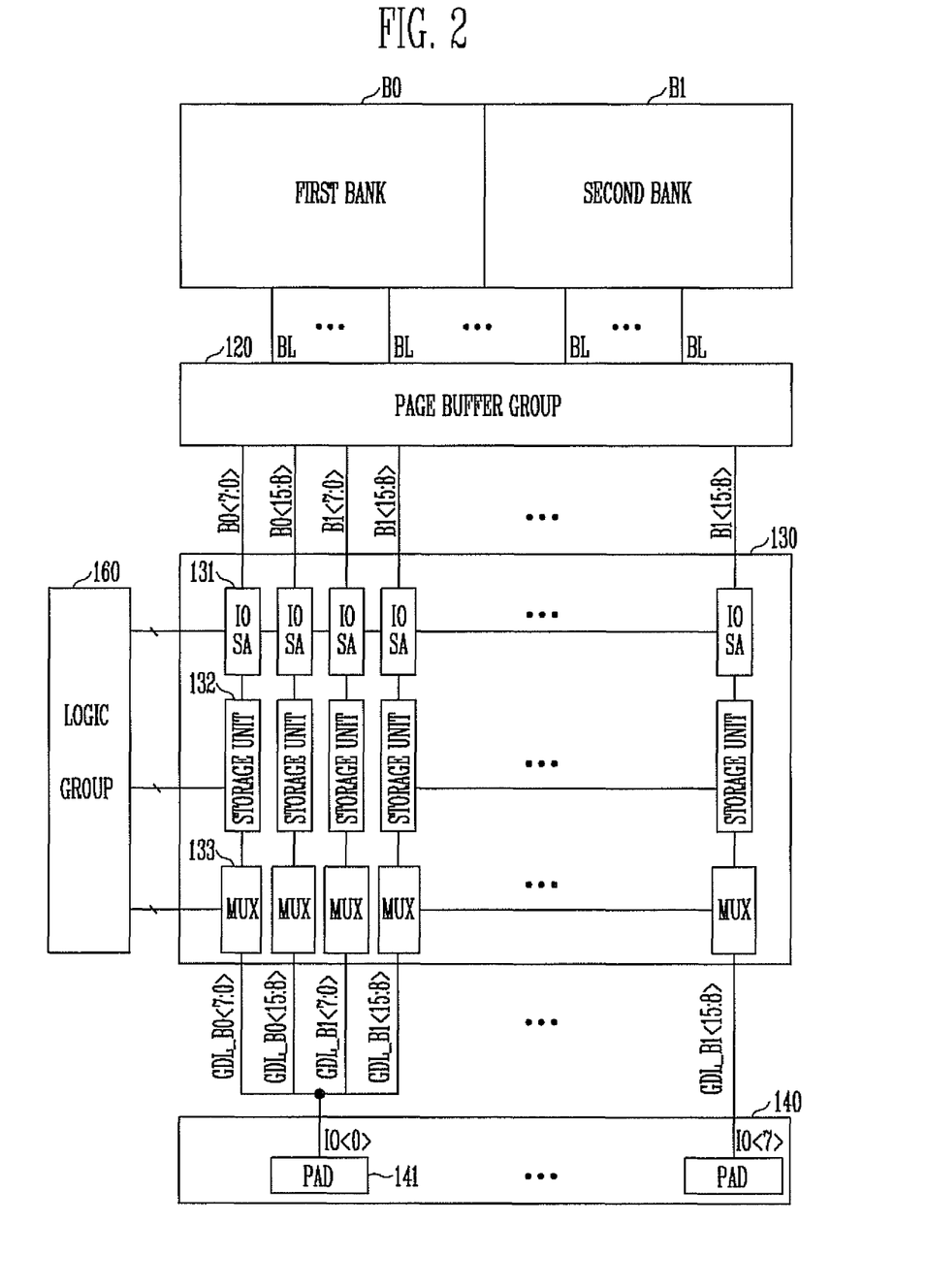
FIG. 2 is a diagram illustrating a page buffer group, a data I/O circuit, and an I/O pad unit in FIG. 1.

FIG. 2 is a diagram illustrating the page buffer group, the data I/O circuit, and the I/O pad unit in FIG. 1.

Referring to FIG. 2, the page buffer group 120 is coupled to the data I/O circuit 130 through data I/O lines B0<7:0>, B0<15:8>, B1<7:0>, and B1<15:8>. The data I/O circuit 130 includes sense circuits (hereinafter referred to as IOSAs) 131 for sensing data outputted through the data I/O lines B0<7:0>, B0<15:8>, B1<7:0>, and B1<15:8>, storage units 132, and multiplexers 133.

The IOSAs 131 output the sensed data in response to control signals IO_DOSTB_B0 and IO_DOSTB_B1 generated by the logic group 160. The data outputted from the IOSAs 131 are stored in the storage units 132.

Here, the storage units 132 store the data received from the IOSAs 131 in response to control signals generated by the logic group 160 and outputs the stored data to the multiplexers 133.

The multiplexers 133 are coupled between the storage units 132 and the pads 141 of the I/O pad unit 140. The data outputted from the multiplexers 133 is outputted to global lines GDL_B0_<7:0>, GDL_B0<15:8>, GDL_B1<7:0>, and GDL_B1<15:8>. The global lines GDL₁_B0_<7:0>, GDL_B0<15:8>, GDL_B1<7:0>, and GDL_B1<15:8> are coupled to the I/O lines IO<7:0>. The multiplexers 133 transfer data selected according to a bank, from among the data outputted from the storage units 132, to the I/O lines IO<7:0> through the global lines GDL_B0_<7:0>, GDL_B0<15:8>, GDL_B1<7:0>, and GDL_B1<15:8>. The data is transferred to the pads 141 through the I/O lines IO<7:0>. The transferred data is externally outputted through the pads 141. Here, the data is outputted from the pads 141 in response to a control signal RENPAD which is generated by an external controller (not shown) coupled to the logic group 160 or the semiconductor memory device 100.

Figure 3A:
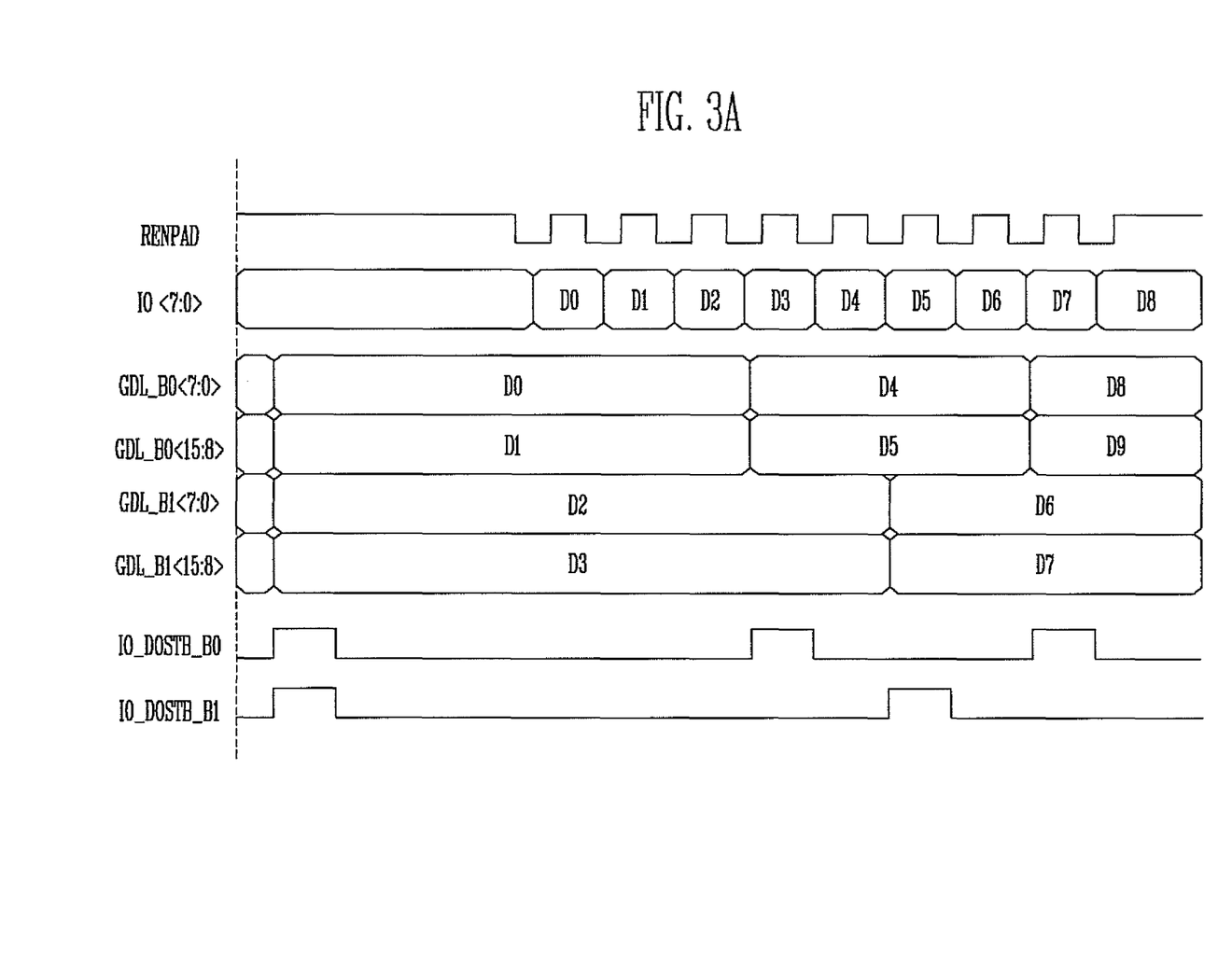
FIG. 3A is a timing diagram illustrating a common data output process.

FIG. 3A is a timing diagram illustrating a common data output process.

In FIG. 3A, data is transferred to the I/O pad unit 140 through the global lines GDL_B0_<7:0>, GDL_B0<15:8>, GDL_B1<7:0>, and GDL_B1<15:8> for externally outputting data outputted to a common data I/O line.

Referring to FIG. 3A, data is transferred to the IOSAs 131 in FIG. 2 through the data I/O lines B0<7:0>, B0<15:8>, B1<7:0>, and B1<15:8> and is then loaded on the global lines GDL_B0<7:0>, GDL_B0<15:8>, GDL_B1<7:0>, and GDL_B1<15:8> in response to the control signals IO_DOSTB_B0 and IO_DOSTB_B1. The data loaded on the respective data lines is D0 to D3.

After the data is loaded on the global lines GDL_B0<7:0>, GDL_B0<15:8>, GDL_B1<7:0>, and GDL_B1<15:8>, the control signal RENPAD is enabled. The control signal RENPAD is transferred from the logic group 160 or the external controller (not shown) to the I/O pad unit 140, where the control signal RENPAD is a control signal for data output.

The data loaded on the global lines GDL_B0<7:0>, GDL_B0<15:8>, GDL_B1<7:0>, and GDL_B1<15:8> is outputted to the I/O pad unit 140 in response to the control signal RENPAD.

In order to reduce the time that it takes to output data from the semiconductor memory device 100, the data is loaded on the global lines GDL_B0<7:0>, GDL_B0<15:8>, GDL_B1<7:0>, and GDL_B1<15:8> in advance before the data is externally outputted. To this end, each of the storage units 132 has a register. In further increasing the data output speed, next data (that is, fifth data) loaded on the four global lines GDL_B0<7:0>, GDL_B0<15:8>, GDL_B1<7:0>, and GDL_B1<15:8> may not be output at a desired time.

To address such a feature, in an exemplary embodiment of this disclosure, an appropriate storage means such as a pipe latch circuit may be used for the data output, and the number of data loaded in advance is increased in order to increase the output speed.

Figure 3B:
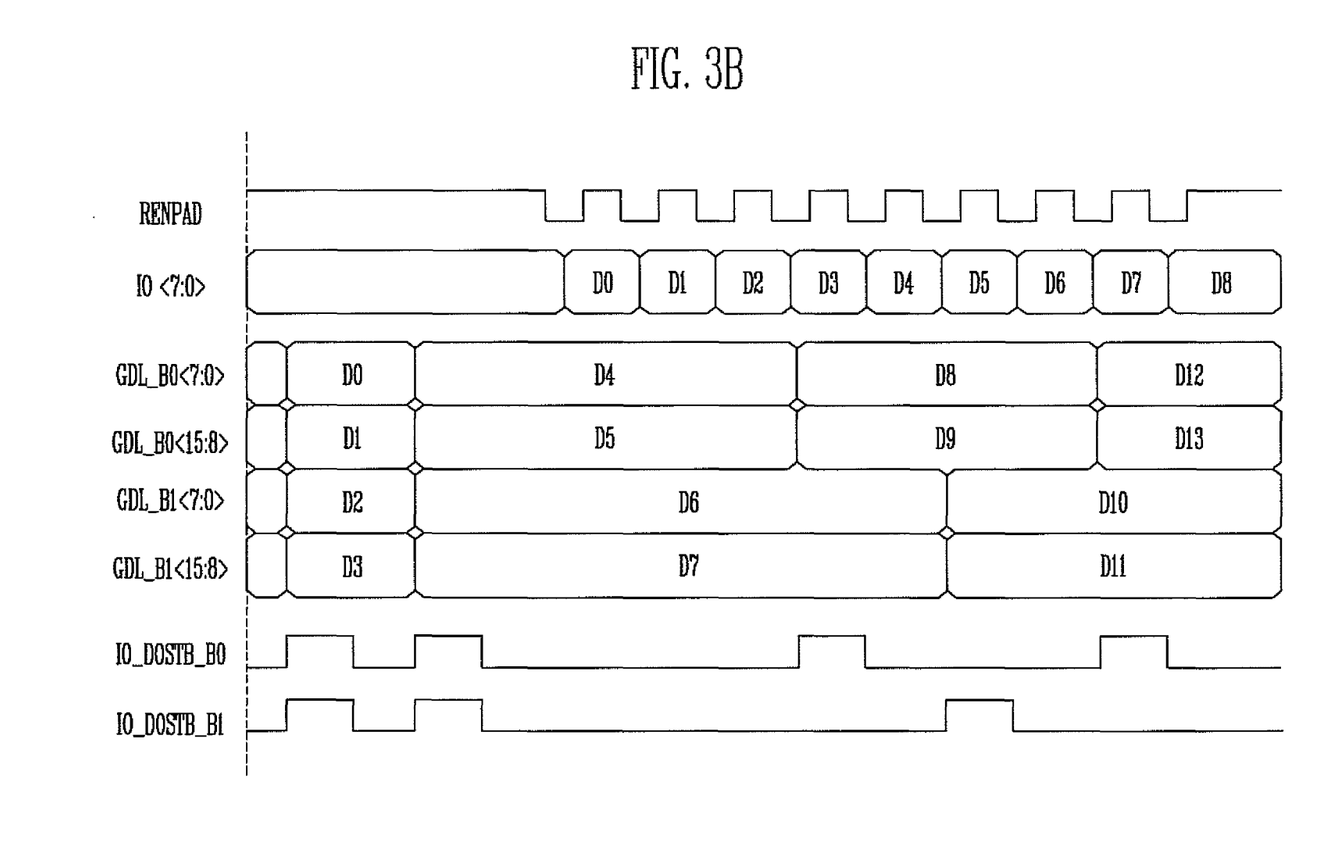
FIG. 3B is a timing diagram illustrating a data output according to an exemplary embodiment of this disclosure.

FIG. 3B is a timing diagram illustrating the data output according to an exemplary embodiment of this disclosure.

Referring to FIG. 3B, the control signals IO_DOSTB_B0 and IO_DOSTB_B1 are inputted twice in advance before data is outputted. That is, the data loading operations are first performed twice, and an operation of outputting the data is then performed.

Details of the data I/O circuit 130 are described as follows.

Figure 4:
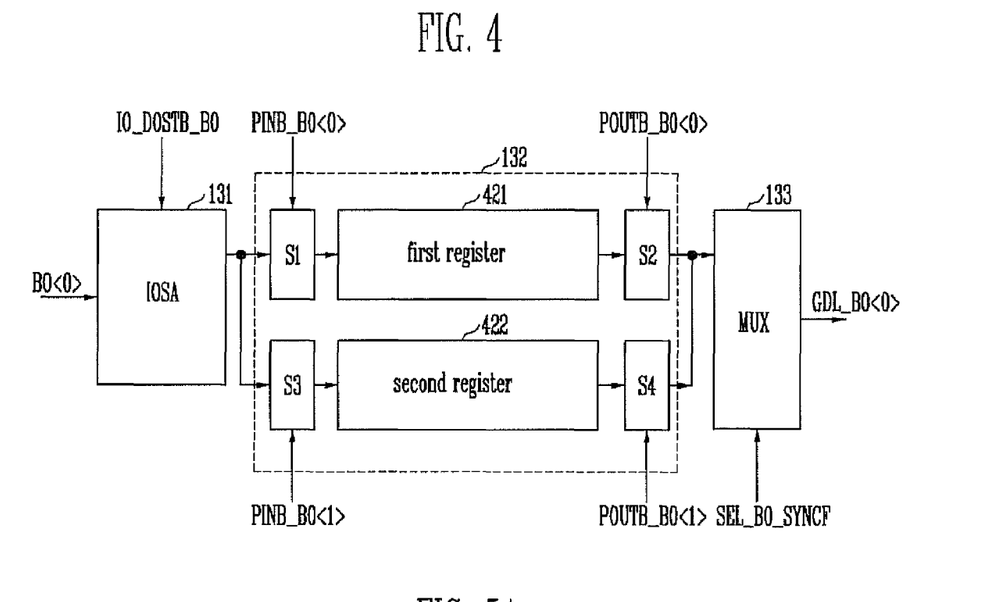
FIG. 4 is a diagram showing the data output circuit of the data I/O circuit according to an exemplary embodiment of this disclosure.

FIG. 4 is a diagram showing details of the data output circuit of the data I/O circuit 130 according to an exemplary embodiment of this disclosure. It is to be noted that FIG. 4 shows portions of the I/O circuit 130 coupled between a data I/O line B0<0> and a global line GDL_B0<0>.

Referring to FIG. 4, the data I/O circuit 130 according to the exemplary embodiment of this disclosure includes the IOSA 131, the storage unit 132, and the multiplexer 133.

Details of the control signal IO_DOSTB_B0 for controlling the data I/O circuit 130 and the logic group 160 are described later.

The IOSA 131 is enabled in response to the control signal IO_DOSTB_B0 and configured to sense data outputted from, for example, the data I/O line B0<0> and output the sensed data.

The data outputted from the IOSA 131 is sent to the storage unit 132. The storage unit 132 includes first to fourth switches S1 to S4 and first and second registers 421 and 422 for temporarily storing the data outputted from the IOSA 131.

The first and third switches S1 and S3 each provide a path so that the data of the IOSA 131 is inputted to the first and the second registers 421 and 422. The second and fourth switches S2 and S4 each provide a path so that the data inputted to the first and second registers 421 and 422 is outputted to the multiplexer 133. According to an example, while data is outputted from one register, new data is input into the other register.

First and second input switching signals PINB_B0<0> and PINB_B0<1> and first and second output switching signals POUTB_B0<0> and POUTB_B0<1> for operating the first to fourth switches S1 to S4 are generated by the logic group 160.

The multiplexer 133 outputs the data of the first and second registers 421 and 422 to the global line GDL_B0<0> in response to a control signal SEL_B0_SYNCF generated by the logic group 160.

According to an example, the multiplexer 133 outputs the data, received from the first and the second registers 421 and 422, in response to enabling of the control signal SEL_B0_SYNCF rather than selectively output the data. For example, the multiplexer 133 may output the received data to the output stage like a D flip-flop.

Details of the logic group 160 for outputting the control signals to control the operation of the data I/O circuit 130 are described as follows.

Figure 5A:
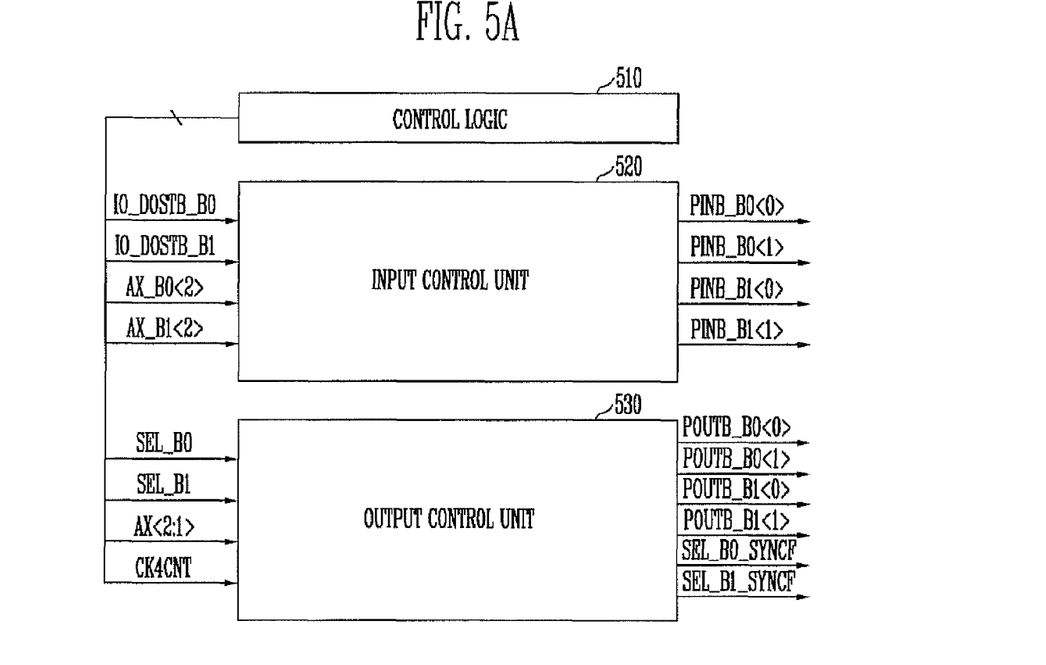
FIG. 5A is a diagram showing a logic group.
Figure 5B:
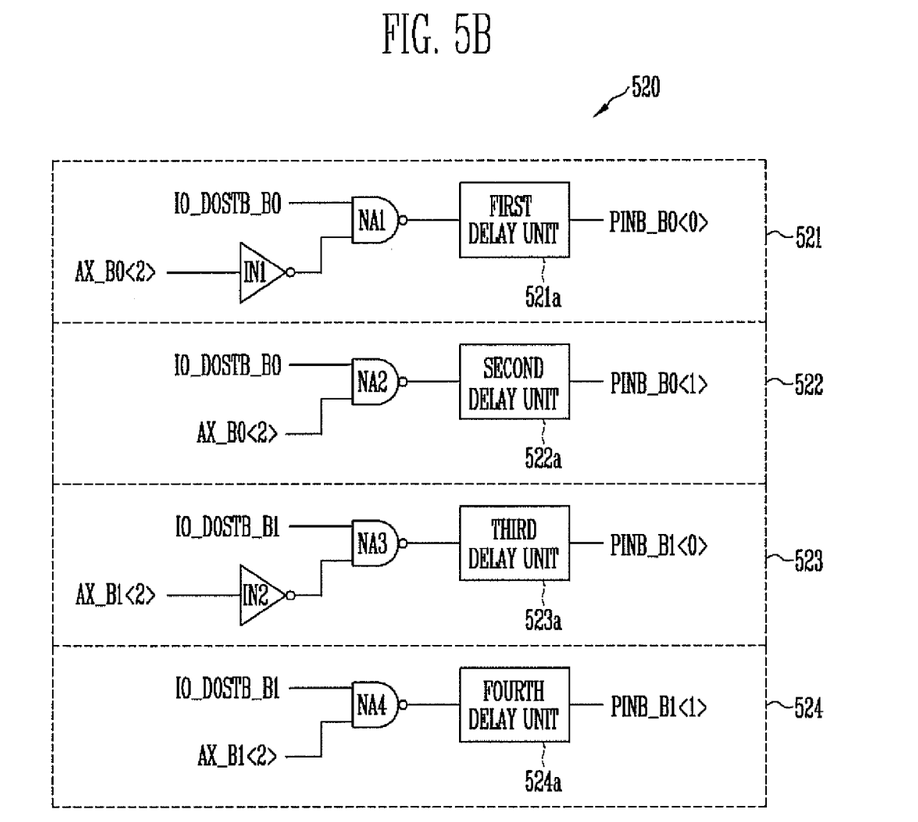
FIG. 5B is a diagram showing the input control unit of a logic group of FIG. 5A.
Figure 5C:
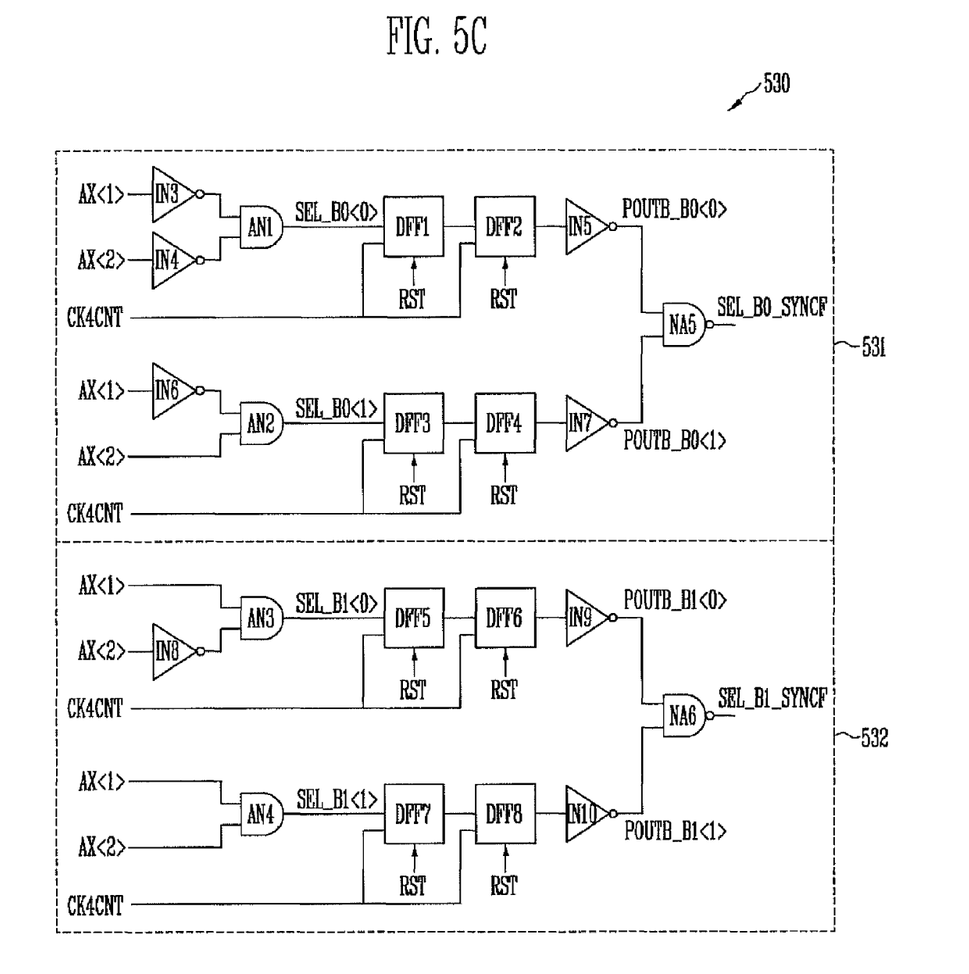
FIG. 5C is a diagram showing the output control unit of a logic group of FIG. 5A.

FIG. 5A is a diagram showing the logic group 160, FIG. 5B is a diagram showing the input control unit of the logic group 160 of FIG. 5A, and FIG. 5C is a diagram showing the output control unit of the logic group 160 of FIG. 5A.

Referring to FIG. 5A, the logic group 160 includes a control logic 510, an input control unit 520, and an output control unit 530.

The control logic 510 generates a control signal for controlling operations of the semiconductor memory device 100.

For example, the control logic 510 generates the control signals IO_DOSTB_B0 and IO_DOSTB_B1 for controlling the operation of the IOSA 131 of the data I/O circuit 130.

The control logic 510 further generates addresses AX_B0<2>, AX_B1<2>, and AX<2:1>, based on addresses received through the I/O pad unit 140, a clock signal CK4CNT, and first and second bank selection signals SEL_B0 and SEL_B1.

The input control unit 520 generates the first to fourth input switching signals PINB_B0<0>, PINB_B0<1>, PINB_B1<0>, and PINB_B1<1> to be inputted to the storage unit 132 of the data I/O circuit 130, based on the addresses AX_B0<2> and AX_B1<2> and the control signals IO_DOSTB_B0 and IO_DOSTB_B1.

The output control unit 530 generates the first to fourth output switching signals POUTB_B0<0>, POUTB_B0<1>, POUTB_B1<0>, and POUTB_B1<1> and the control signals SEL_B0_SYNCF and SEL_B1_SYNCF, based on the address AX<2:1>, the first and the second bank selection signals SEL_B0 and SEL_B1, and the clock signal CK4CNT.

Referring to FIG. 5B, the input control unit 520 includes first to fourth input control circuits 521 to 524 for generating the first to fourth input switching signals PINB_B0<0>, PINB_B0<1>, PINB_B1<0>, and PINB_B1<1>.

The first and second input control circuits 521 and 522 generate the first and second input switching signals PINB_B0<0> and PINB_B0<1>, respectively, for storing data, received from the first bank B0, in the storage unit 132.

The third and the fourth input control circuits 523 and 524 generate the third and the fourth input switching signals PINB_B1<0> and PINB_B1<1>, respectively, for storing data, received from the second bank B1, in the storage unit 132.

The first input control circuit 521 includes a first inverter IN1, a first NAND gate NA1, and a first delay unit 521a.

The first inverter IN1 inverts the address AX_B0<2> and outputs an inverted address. The address AX_B0<2> is included in the column address of the first bank B0.

The first NAND gate NA1 performs a NAND combination of the control signal IO_DOSTB_B0 and the output of the first inverter IN1 and outputs a result of the combination. The first delay unit 521a delays the output of the first NAND gate NA1 and outputs a delayed output. The output of the first delay unit 521a is the first input switching signal PINB_B0<0>.

The second input control circuits 522 includes a second NAND gate NA2 and a second delay unit 522a. The second NAND gate NA2 performs a NAND combination of the address AX_B0<2> and the control signal IO_DOSTB_B0 and outputs a result of the combination.

The output of the second NAND gate NA2 is inputted to the second delay unit 522a. The second delay unit 522a delays the output of the second NAND gate NA2 and outputs a delayed output. The output of the second delay unit 522a is the second input switching signal PINB_B0<1>.

The third input control circuits 523 includes a second inverter IN2, a third NAND gate NA3, and a third delay unit 523a.

The second inverter IN2 inverts the address AX_B1<2> and outputs a delayed address. The address AX_B1<2> is included in the column address of the second bank B1.

The third NAND gate NA3 performs a NAND combination of the control signal IO_DOSTB_B1 and the output of the second inverter IN2 and outputs a result of the combination. The output of the third NAND gate NA3 is inputted to the third delay unit 523a.

The third delay unit 523a delays the output of the third NAND gate NA3 and outputs a delayed output. The output of the third delay unit 523a is the third input switching signal PINB_B1<0>.

The fourth input control circuits 524 includes a fourth NAND gate NA4 and a fourth delay unit 524a.

The fourth NAND gate NA4 performs a NAND combination of the control signal IO_DOSTB_B1 and the address AX_B0<2> and outputs a result of the combination. The output of the fourth NAND gate NA4 is inputted to the fourth delay unit 524a. The fourth delay unit 524a delays the output of the fourth NAND gate NA4 and outputs a delayed output. The output of the fourth delay unit 524a is the fourth input switching signal PINB_B1<1>.

The data received from the IOSA 131 is stored in the first and the second registers 421 and 422 of the storage unit 132 in response to the first to the fourth input switching signals PINB_B0<0>, PINB_B0<1>, PINB_B1<0>, and PINB_B1<1> generated by the first to fourth input control circuits 521 to 524, respectively.

Details of the output control unit 530 are described as follows.

Referring to FIG. 5C, the output control unit 530 includes first and second output control circuits 531 and 532.

The first output control circuit 531 generates the first and the second output switching signals POUTB_B0<0> and POUTB_B0<1> and the control signal SEL_B0_SYNCF. The second output control circuit 532 generates the third and the fourth output switching signals POUTB_B1<O> and POUTB_B1<1> and the control signal SEL_B1_SYNCF.

The first output control circuit 531 includes third to seventh inverters IN3 to IN7, first and second AND gates AN1 and AN2, first to fourth D flip-flops DFF1 to DFF4, and a fifth NAND gate NA5.

The third inverter IN3 inverts the address AX<1> and outputs an inverted output. The fourth inverter IN4 inverts the address AX<2> and outputs an inverted output.

The outputs of the third and the fourth inverters IN3 and IN4 are inputted to the first AND gate AN1. The output of the first AND gate AN1 is inputted to the first D flip-flop DFF1. A D flip-flop outputs received data in response to a clock signal (for example, CK4CNT in FIG. 5C). Accordingly, the first D flip-flop DFF1 transfers the output of the first AND gate AN1 to the second D flip-flop DFF2 in response to the clock signal CK4CNT.

The second D flip-flop DFF2 outputs the data, received from the first D flip-flop DFF1, in response to the clock signal CK4CNT.

The output of the second D flip-flop DFF2 is sent to the fifth inverter IN5. The fifth inverter IN5 inverts the output of the second D flip-flop DFF2 and outputs an inverted output.

The output of the fifth inverter IN5 is the first output switching signal POUTB_B0<0>.

The sixth inverter IN6 inverts the address AX<1> and outputs an inverted output. The addresses AX<2:1> correspond to the external addresses of a bank.

The second AND gate AN2 performs an AND combination of the address AX<2> and the output of the sixth inverter IN6 and outputs a result of the AND operation. The output of the second AND gate AN2 is inputted to the third D flip-flop DFF3. The output of the third D flip-flop DFF3 is inputted to the fourth D flip-flop DFF4. The output of the fourth D flip-flop DFF4 is inputted to the seventh inverter IN7.

The third and fourth D flip-flops DFF3 and DFF4 output the input data in response to the clock signal CK4CNT.

The seventh inverter IN7 inverts the output of the fourth D flip-flop DFF4 and outputs an inverted output. The output of the seventh inverter IN7 is the second output switching signal POUTB_B0<1>.

The first and second output switching signals POUTB_B0<0> and BOUTB_B0<1> are inputted to the fifth NAND gate NA5. The output of the fifth NAND gate NA5 is the control signal SEL_B0_SYNCF.

The second output control circuit 532 includes eighth to tenth inverters IN8 to IN10, third and fourth AND gates AN3 and AN4, fifth to eighth D flip-flops DFF5 to DFF8, and a sixth NAND gate NA6.

The eighth inverter IN8 inverts the address AX<2> and outputs an inverted output.

The third AND gate AN3 performs an AND combination of the address AX<1> and the output of the eighth inverter IN8 and outputs a result of the AND operation. The output of the third AND gate AN3 is inputted to the fifth D flip-flop DFF5.

The output of the fifth D flip-flop DFF5 is inputted to the sixth D flip-flop DFF6. The output of the sixth D flip-flop DFF6 is inputted to the ninth inverter IN9. The ninth inverter IN9 inverts the output of the sixth D flip-flop DFF6 and outputs an inverted output. The output of the ninth inverter IN9 is the third output switching signal POUTB_B1<0>.

The fourth AND gate AN4 performs an AND combination of the addresses AX<2:1> and outputs a result of the AND operation. The output of the fourth AND gate AN4 is inputted to the seventh D flip-flop DFF7. The output of the seventh D flip-flop DFF7 is inputted to the eighth D flip-flop DFF8.

The output of the eighth D flip-flop DFF8 is inputted to the tenth inverter IN10. The output of the tenth inverter IN10 is the fourth output switching signal POUTB_B1<1>.

The fifth to eighth D flip-flops DFF5 to EFF8 output the input data in response to the clock signal CK4CNT.

The sixth NAND gate NA6 performs a NAND combination of the third and fourth output switching signals POUTB_B1<0> and POUTB_B1<1> and outputs a result of the NAND operation. The output of the sixth NAND gate NA6 is the control signal SEL_B1_SYNCF.

The data I/O circuit 130 is operated in response to the control signals generated by the input control unit 520 and the output control unit 530.

According to an exemplary embodiment of this disclosure, before data is outputted, the data is read twice in advance by the global lines GDL_B0<15:0> and GDL_B1<15:0>. Further, the read data stored in the first and the second registers 421 and 422 of the storage unit 132 is twice the amount stored by performing the data read just once in advance.

Figure 6:
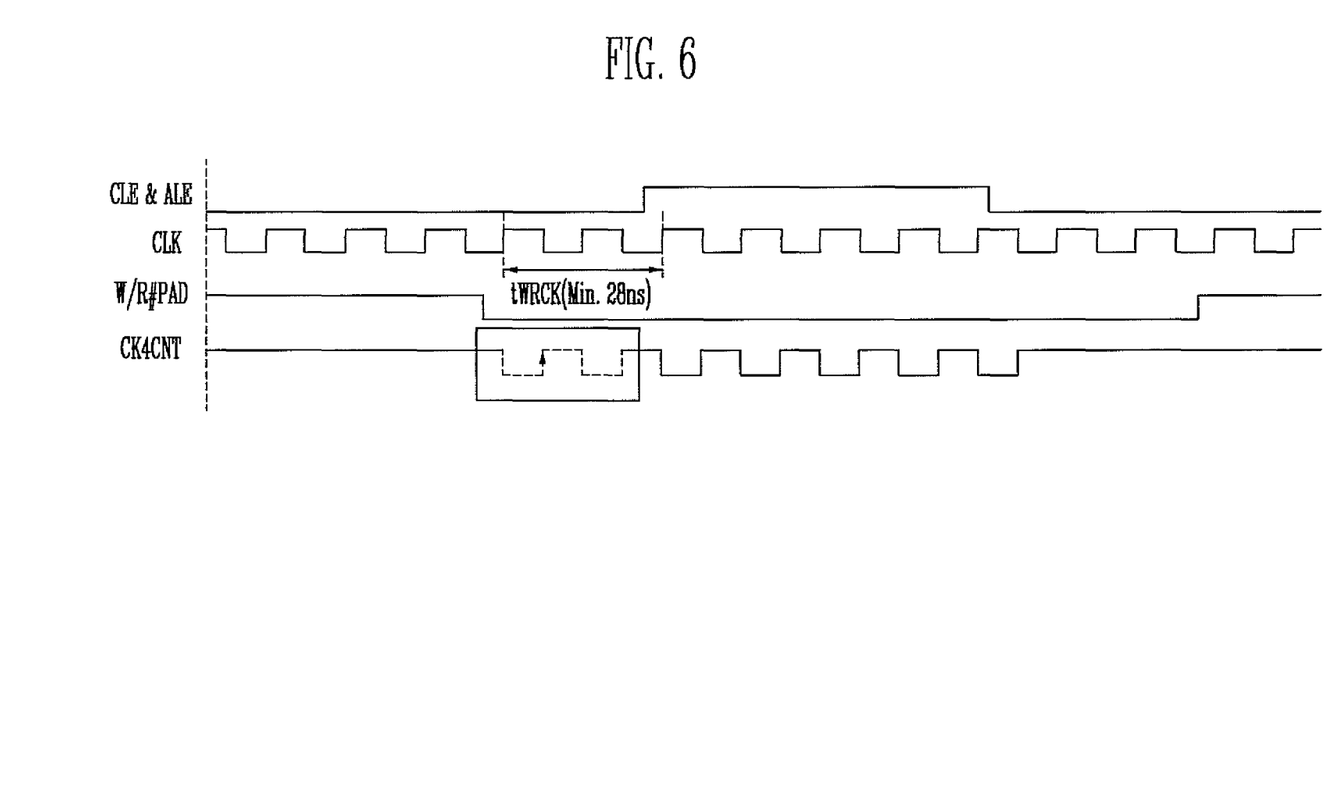
FIG. 6 is a timing diagram illustrating an operation of reading data in advance.

FIG. 6 is a timing diagram illustrating the operation of reading data in advance.

Referring to FIG. 6, before a command input signal CLE (Command Latch Enable) and an address input signal ALE (Address Latch Enable) are enabled, clock cycles of the clock CLK are inputted to output data.

Prior to the input of the clock cycle of the clock CLK at the time of the actual output of read data, the read data is loaded in advance through the global lines in response to the internal clock signal CK4CNT. Here, the read data is first stored in the first and the second registers 421 and 422 of the storage unit 132.

When one of the loaded data is outputted, the register from which the data has been outputted becomes available for receiving new data. Accordingly, new data is loaded on the relevant register.

Figure 7:
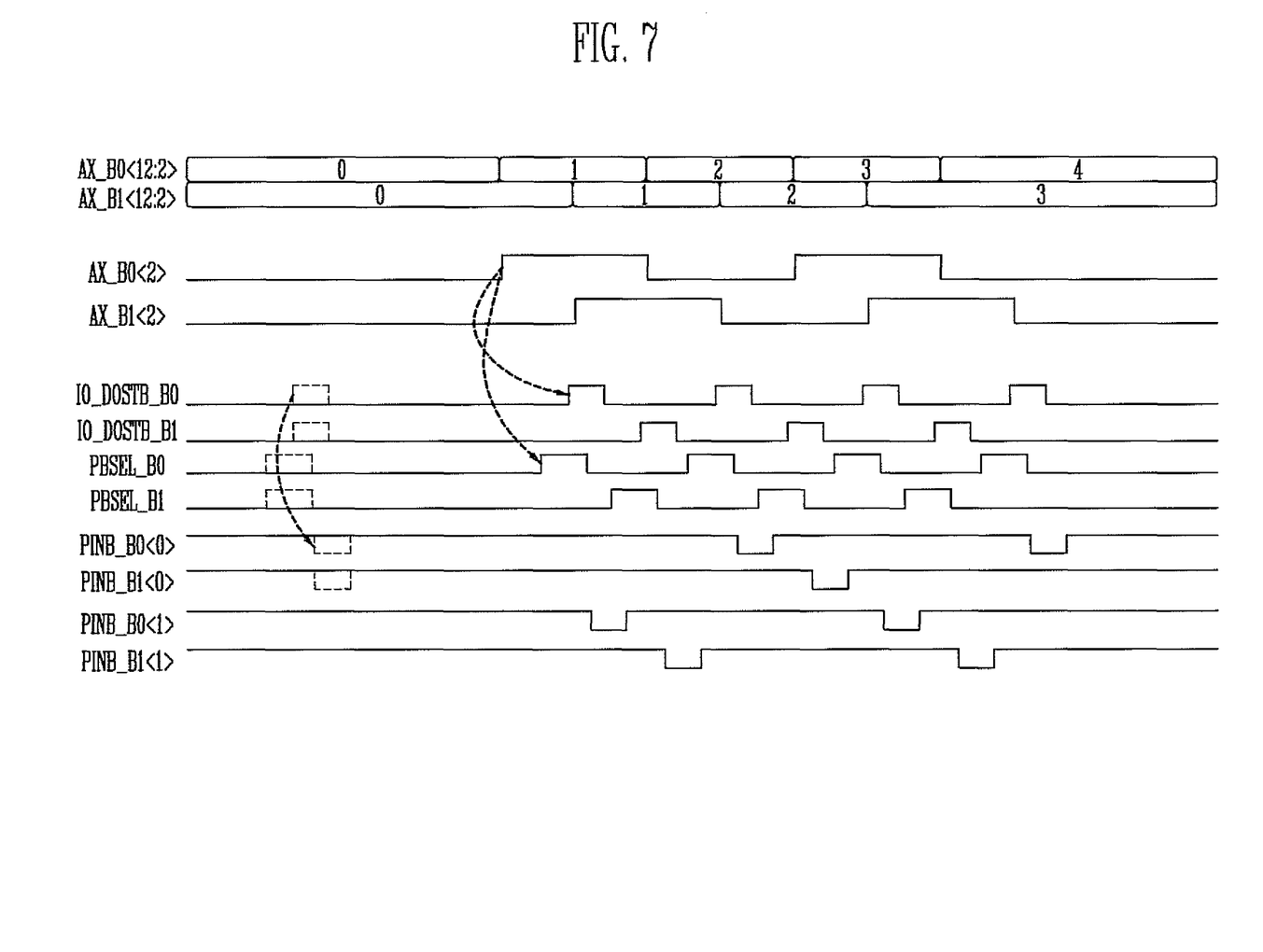
FIG. 7 is an operational timing diagram illustrating the output of a control signal in FIGS. 5A to 5C.

FIG. 7 is an operational timing diagram illustrating the output of a control signal in FIGS. 5A to 5C.

Referring to FIG. 7, when the column addresses AX_B0<12:2> and AX_B1<12:2> of the first and the second banks B0 and B1 are inputted, the first to fourth input switching signals PINB_B0<0>, PINB_B0<1>, PINB_B1<0>, and PINB_B1<1> are sequentially outputted in response to the addresses AX_B0<2> and AX_B1<2> and the control signals IO_DOSTB_B0 and IO_DOSTB_B. Accordingly, two bits of data are stored in each of the first and second registers 421 and 422 of the storage unit 132.

Two bits of data are read twice in advance and then sequentially outputted. Since two b its of data are read twice for each register in advance, a total of the eight bits of data are prepared to in advance be outputted through the four global lines GDL_B0<7:0>, GDL_B0<15:8>, GDL_B1<7:0>, and GDL_B1<15:8>.

Thereafter, during the time for which first set of four data loaded in advance is outputted through the I/O pad unit 140, a new set of four data (for example, a third set of four data) is loaded in advance. Accordingly, data can be rapidly outputted without stopping for data load.

Figure 8:
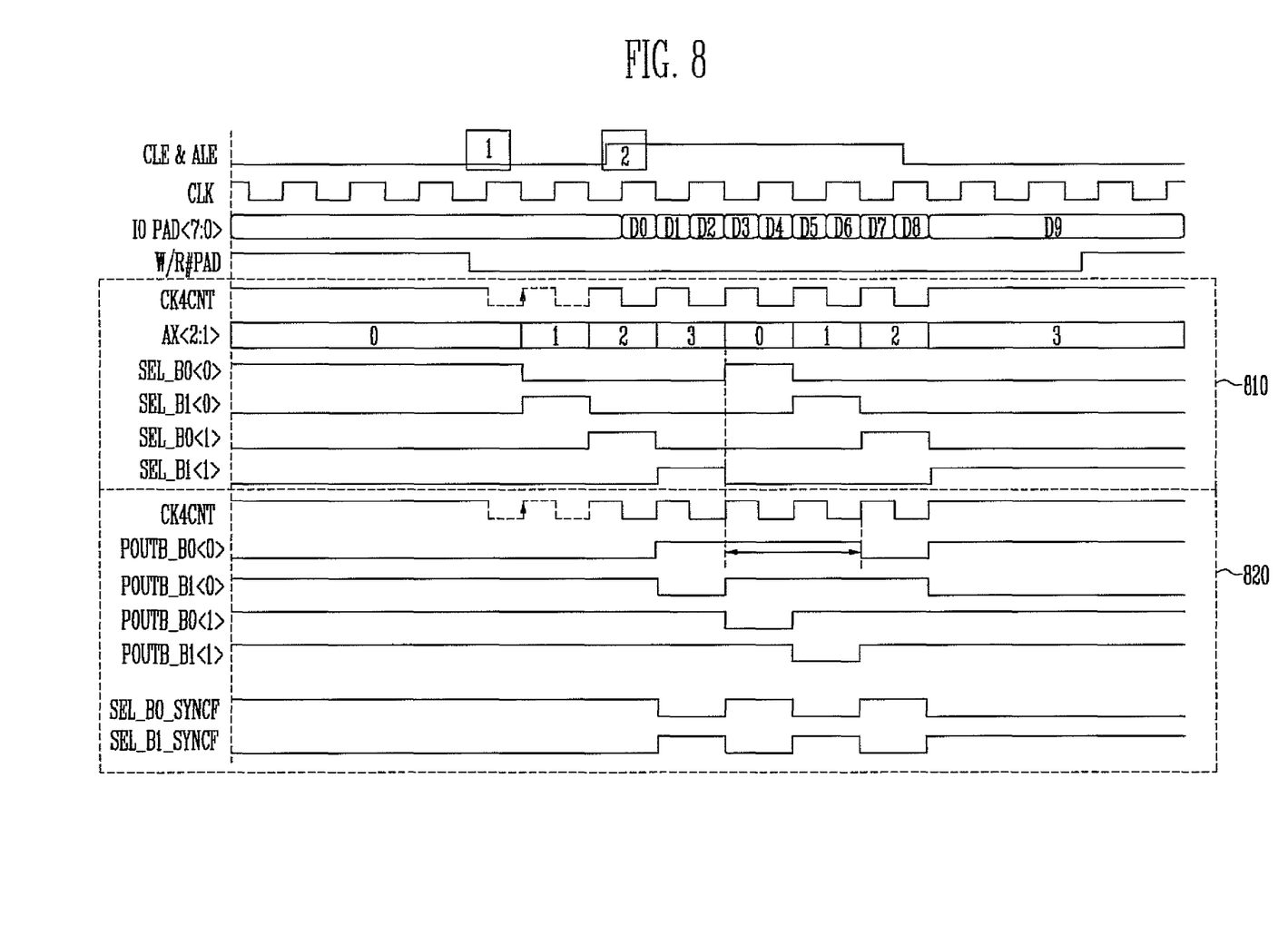
FIG. 8 is a timing diagram illustrating a data output according to an exemplary embodiment of this disclosure.

FIG. 8 is a timing diagram illustrating a data output according to an exemplary embodiment of this disclosure.

A timing diagram shown in a region 810 of FIG. 8 corresponds to a timing diagram when data is loaded just once in advance on each of the global lines GDL_B0<7:0>, GDL_B0<15:8>, GDL_B1<7:0>, and GDL_B1<15:8>. A timing diagram shown in a region 820 of FIG. 8 corresponds to a timing diagram when data is loaded twice in advance on each of the global lines GDL_B0<7:0>, GDL_B0<15:8>, GDL_B1<7:0>, and GDL_B1<15:8> through the data I/O circuit 130 and the logic group 160 of FIG. 4 and FIGS. 5A to 5C according to an exemplary embodiment of this disclosure.

In FIG. 8, in the case where data is loaded just once in advance on each of the global lines GDL_B0<7:0>, GDL_B0<15:8>, GDL_B1<7:0>, and GDL_B1<15:8> (that is, the region 810), the data is loaded in advance in response to the bank selection signals SEL_B0<0>, SEL_B0<1>, SEL_B1<0>, and SEL_B1<1>. To this end, registers (not shown) coupled to the global lines GDL_B0<7:0>, GDL_B0<15:8>, GDL_B1<7:0>, and GDL_B1<15:8> are to be used.

In the case where data is loaded just once in advance as described above at an advance read operation, an additional time for loading new data is taken after the loaded data is outputted.

In the case where data is loaded twice in advance according to the exemplary embodiment of this disclosure, however (that is, the region 820), two data loaded in advance is sequentially outputted in response to each of the first to fourth output switching signals POUTB_B0<0>, POUTB_B0<1>, POUTB_B1<0>, and POUTB_B1<1> according to the operation of FIG. 7. Here, when one of the two data loaded in advance is outputted, new data is loaded. Accordingly, data can be rapidly outputted without a waiting time for data loading.

Effectiveness of this method is more pronounced when the time taken to load data once is longer than the time taken to output the data.

That is, if the time taken to load data just once is longer than the time taken to output the data, an additional time to load new data is taken after the completion of the output of the loaded data. If two data is loaded in advance as the present disclosure, second data is loaded in advance during the time for which first data is outputted, and an operation of loading third data can be performed in advance. Accordingly, the output of data is not stopped during the time for which data is loaded.

In accordance with the semiconductor memory device and the method of operating the same according to the exemplary embodiments of this disclosure, the amount of data outputted at one step and the data output speed are increased by increasing the size that data to be outputted is loaded. Here, such an increase in the data output speed may be achieved without increasing the number of data lines.

What is claimed is:

1. A semiconductor memory device, comprising:
    a page buffer configured to store data received from selected memory cells in response to a read command;
    a first register configured to store first data received from the page buffer in response to a first control signal;
    a second register configured to store second data received from the page buffer in response to a second control signal;
    a data I/O circuit configured to, while the first or second data is outputted from the first register or the second register, respectively, input third data received from the page buffer to the other one of the first and second registers;
    a multiplexer configured to receive the first and second data in response to third and fourth control signals and alternately output the first and second data in response to a data output signal; and
    a control logic configured to sequentially supply the first control signal and the second control signal in outputting the first and second data.

2. The semiconductor memory device of claim 1, wherein the data I/O circuit further comprises a sense circuit configured to sense the first and second data in response to at least one sense control signal and output the sensed data.

3. The semiconductor memory device of claim 2, wherein the data I/O circuit comprises:
    a first switching circuit configured to transfer the first data to the first register in response to the first control signal;
    a second switching circuit configured to transfer the second data to the second register in response to the second control signal;
    a third switching circuit configured to transfer the first data stored in the first register to the multiplexer in response to the third control signal; and
    a fourth switching circuit configured to transfer the second data stored in the second register to the multiplexer in response to the fourth control signal, wherein the first control signal and the fourth control signal are simultaneously enabled or the second control signal and the third control signal are simultaneously enabled.

4. The semiconductor memory device of claim 3, wherein the control logic comprises:
    a control unit configured to generate the at least one sense control signal, input address bits, and a clock signal;
    an input control unit configured to generate the first and second control signals based on the at least one sense control signal and the input address bits; and
    an output control unit configured to generate the third and the fourth control signals based on the at least one sense control signal, the input address bits, and the clock signal.

5. The semiconductor memory device of claim 4, wherein the input control unit comprises:
    a first inverter configured to invert an input address bit of the input address bits;
    a first NAND gate configured to perform a NAND combination of a signal of the at least one sense signal and an output of the first inverter;
    a first delay unit configured to delay an output of the first NAND gate and output the delayed output of the first NAND gate as the first control signal;
    a second NAND gate configured to perform a NAND combination of the input address bit and a signal of the at least one sense signal; and
    a second delay unit configured to delay an output of the second NAND gate and output the delayed output of the second NAND gate as the second control signal.

6. The semiconductor memory device of claim 4, wherein the output control unit comprises:
    second and third inverters configured to invert first and second input address bits of the input address bits, respectively;
    a first AND gate configured to perform an AND combination of outputs of the second and the third inverters;
    a first flip-flop configured to output an output of the first AND gate in response to the clock signal;
    a second flip-flop configured to output the output of the first flip-flop in response to the clock signal;
    a fourth inverter configured to invert the output of the second flip-flop and output the inverted output of the second flip-flop as the third control signal;
    a fifth inverter configured to invert the first input address bit;
    a second AND gate configured to perform an AND combination of the first input address bit and an output of the fifth inverter;
    a third flip-flop configured to output the output of the second AND gate in response to the clock signal;
    a fourth flip-flop configured to output the output of the second flip-flop in response to the clock signal; and
    a sixth inverter configured to invert the output of the fourth flip-flop and output the inverted output of the fourth flip-flop as the fourth control signal.

7. The semiconductor memory device of claim 6, further comprising a third NAND gate configured to perform a NAND combination of the third and the fourth control signals and output the data output signal.

8. The semiconductor memory device of claim 1, wherein the data output signal is a logical combination of the third and fourth control signals.

9. The semiconductor memory device of claim 1, wherein the control logic is configured to control the data I/O circuit to perform a read operation twice in an initial advance read operation and perform a read operation once in each subsequent advance read operation.

10. A method of operating a semiconductor memory device, the method comprising:
    storing a plurality of data read from selected memory cells in page buffers;
    storing a first data group of the plurality of data in a first register group and storing a second data group of the plurality of data in a second register group;
    outputting the first data group stored in the first register group; and
    outputting the second data group stored in the second register group and storing a third data group of the plurality of data in the first register group during outputting the second data group.

11. The method of claim 10, further comprising, outputting the third data group stored in the first register group and storing a fourth data group of the plurality of data in the second register group during the outputting the third data group.

* * * * *